(12) United States Patent
Chow et al.

(10) Patent No.: US 7,749,396 B2
(45) Date of Patent: *Jul. 6, 2010

(54) METHOD OF MANUFACTURING FINE FEATURES FOR THIN FILM TRANSISTORS

(75) Inventors: Eugene M. Chow, Fremont, CA (US); William S. Wong, San Carlos, CA (US); Michael Chabinyc, Burlingame, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1107 days.

This patent is subject to a terminal disclaimer.

(21) Appl. No.: 11/388,731

(22) Filed: Mar. 24, 2006

(65) Prior Publication Data

US 2007/0221611 A1 Sep. 27, 2007

(51) Int. Cl.
*H01B 13/00* (2006.01)
*C23F 1/00* (2006.01)

(52) U.S. Cl. .............................. 216/13; 216/41; 216/58; 216/74; 257/E29.151

(58) Field of Classification Search ........................ None
See application file for complete search history.

(56) References Cited

U.S. PATENT DOCUMENTS

| | | | |
|---|---|---|---|
| 4,690,715 A | 9/1987 | Allara et al. |
| 4,964,945 A | 10/1990 | Calhoun |
| 5,900,160 A | 5/1999 | Whitesides et al. |
| 6,180,239 B1 | 1/2001 | Whitesides et al. |
| 6,256,077 B1 | 7/2001 | Baek |
| 6,742,884 B2 | 6/2004 | Wong et al. |
| 6,872,320 B2 | 3/2005 | Wong et al. |
| 6,972,261 B2 | 12/2005 | Wong et al. |
| 2002/0058416 A1 | 5/2002 | Kim et al. |
| 2002/0154187 A1 | 10/2002 | Wong et al. |
| 2003/0027082 A1 | 2/2003 | Wong et al. |
| 2004/0002225 A1 | 1/2004 | Wong et al. |
| 2004/0203181 A1 | 10/2004 | Shang et al. |

OTHER PUBLICATIONS

U.S. Appl. No. 11/184,304, filed Jul. 18, 2005, Arias, et al.
U.S. Appl. No. 11/193,847, filed Jul. 28, 2005, Wong, et al.
U.S. Appl. No. 11/388,718, filed Mar. 24, 2006, Chow, et al.
W. S. Wong, et al., "Amorphous silicon thin-film transistors and arrays fabricated by jet printing", Appl. Phys. Lett., 80, 610 (2002).
Mikami, Yoshiro, et al. "A New Patterning Process Concept for Large-Area Transistor Circuit Fabrication Without Using an Optical Mask Aligner", IEEE Transactions on Electron Devices, 41, 306 (1994).
Biercuk, M. J., et al. Low-temperature atomic-layer-deposition liftoff method for microelectronic and nanoelectronic applications, Appl. Phys. Lett., 83, 2405 (2003).

(Continued)

*Primary Examiner*—Allan Olsen
(74) *Attorney, Agent, or Firm*—Fay Sharpe LLP

(57) ABSTRACT

A process for fabricating fine features such as small gate electrodes on a transistor. The process involves the jet-printing of a mask and the plating of a metal to fabricate sub-pixel and standard pixel size features in one layer. Printing creates a small sub-pixel size gap mask for plating a fine feature. A second printed mask may be used to protect the newly formed gate and etch standard pixel size lines connecting the small gates.

26 Claims, 13 Drawing Sheets

OTHER PUBLICATIONS

Delamarche, Emmanuel, et al., "Electroless Deposition of NiB on 15 Inch Glass Substrates for the Fabrication of Transistor Gates for Liquid Crystal Displays", American Chemical Society, 2003.

H. Sirringhaus, et al., High-Resolution Inkjet Printing of All-Polymer Transistor Circuits, Science, Dec. 15, 2000, vol. 290, pp. 2123-2126, XP002481766.

European Search Report dated Jun. 16, 2008.

METHOD OF MANUFACTURING FINE FEATURES FOR THIN FILM TRANSISTORS

This invention was made with United States Government support under Cooperative Agreement Number 70NANB3H3029 awarded by the National Institute of Standards and Technology (NIST). The United States Government has certain rights in the invention.

CROSS REFERENCE TO RELATED PATENTS AND APPLICATIONS

The following applications, the disclosures being totally incorporated herein by reference are mentioned:

U.S. application Ser. No. 11/388,718, filed contemporaneously herewith, entitled "METHOD USING MONOLAYER ETCH MASKS IN COMBINATION WITH JET-PRINTED MASKS," by Eugene M. Chow, et al.; and U.S. application Ser. No. 11/193,847, entitled "PATTERNED-PRINT THIN-FILM TRANSISTORS WITH TOP GATE GEOMETRY," by William S. Wong, et al.

BACKGROUND

In recent years, backplanes over large areas with actively addressed thin-film transistors (TFTs) have found important applications in the production of pixelated devices such as image capturing devices, display devices, and sensor devices. In recent years, the increasingly widespread use of display device alternatives to the cathode ray tube (CRT) has driven the demand for large-area electronic arrays for displays. In particular, active matrix addressed liquid crystal displays are commonly used in lap-top computers and for televisions. However, fabricating such large-area TFT arrays is expensive. A large part of the fabrication cost of the large-area TFT arrays arises from the photolithographic process used to pattern the array. In order to avoid such photolithographic processes, direct marking techniques have been considered as an alternative to photolithography.

Examples of direct marking techniques used in place of photolithography include utilizing a xerographic process to deposit a toner that acts as an etch mask and using an ink-jet printhead to deposit a liquid mask. Both techniques have corresponding problems. Toner-based materials are hard to control and difficult to remove after deposition.

The use of ink-jetted liquids to directly write etch masks is a practical alternative to printed toner although jet printing also possesses inherent complexities. Controlling the feature sizes of printed liquid masks is difficult due to spreading of the liquid on the surface after deposition. For example, when liquid drops are deposited onto a surface, the droplet configuration is largely determined by its wetting properties. Typically, small wetting or contact angles (the angle formed by the edge of a droplet and the substrate surface) are required to obtain good adhesion to a surface but this condition allows the liquid to spread and form relatively large features. On the other hand, if the liquid does not wet the surface due to a high surface energy, a large contact angle will form allowing for the formation of small drop features. However, these printed droplets may adhere poorly. Neither situation is desirable in semiconductor processing—the small contact angle droplets increase feature size while large contact angle droplets give unreliable patterning.

Special piezoelectric ink-jet printheads allow generation of low droplet volumes. Small printed features have been obtained using ink-jet printheads as described in W. S. Wong, et al., "Amorphous silicon thin-film transistors and arrays fabricated by jet printing" in Appl. Phys. Lett., 80, 610 (2002). In the described reference, wax etch masks patterned by ink-jet printing are used to produce feature sizes on the order of 20-40 microns with layer registration to within a few micrometers. However, even with these printheads, the small sizes of features critical to the fabrication of large-area microelectronic arrays have been difficult to achieve. In using a jet-printed feature as an etch mask, the minimum feature size was limited by the smallest droplet, typically in the range of 20 microns.

In many cases, the use of a smaller channel length transistor with a comparatively small gate electrode can improve the performance of a backplane circuit. One possible solution is to use a liftoff process where one uses the ability to print a mask on a substrate where the gaps between the printed mask are small relative to the printed features themselves and then to deposit a metal film over the whole substrate. In this process, the metal film may cover a portion of the printed mask layer and in some cases may cover the printed mask and substrate completely. The mask is then removed chemically (dissolved in solvent), removing the metal above the mask but leaving the metal between the original mask features. Cracks in the metal around the mask allow solvent to attach the mask material through the metal. However, in some manufacturing processes, liftoff may not be the best solution for fabrication of fine features. Removal of the metal in a bath creates a particle-laden solution that can leave particulates on the surface of the substrate reducing yield in some cases.

Thus, a method of forming smaller features, such as small gate electrodes in thin film transistors, using inexpensive printing techniques is needed.

INCORPORATION BY REFERENCE

The following reference, the disclosure of which is incorporated by reference in its entirety, relates to a method and apparatus for fabricating small feature devices using materials from aqueous or non-aqueous organic solutions: U.S. Pat. No. 6,972,261 issued to Wong, et al., entitled METHOD FOR FABRICATING FINE FEATURES BY JET-PRINTING AND SURFACE TREATMENT.

BRIEF DESCRIPTION

Disclosed herein is a process for fabricating small features using jet printing in combination with growth of a material from a seed layer. The process involves the jet-printing of a mask and the growth of a material to fabricate features that are small relative to the size of the smallest dimension of the printed mask in one layer. Printing a mask with good control of drop to drop registration allows for fabrication of spaces between drops that are smaller than the smallest dimension of the printed features; such masks can be used for growth of a material from an exposed seed layer in the space between the printed mask features. After growth and removal of the printed mask, an optional second printed mask is used to protect the newly formed features and to form a mask for features of dimensions similar to or larger than the smallest achievable dimensions of the printed mask.

In one embodiment a method of patterning a substrate is provided. The method comprises depositing a seed layer on a substrate, depositing a first printed mask to form a fine feature where the fine feature is a gap with a distance smaller than the minimum printed mask dimension, growing a thin film around the first printed mask and on top of the seed layer to form the fine feature, and removing the first printed mask. Optionally, the method may further comprise depositing a second printed mask to pattern a second mask layer aligned to the first patterned fine feature to define a second patterned feature and to mask the fine feature, etching the exposed thin film and underlying seed layer, and removing the second printed mask.

In another embodiment a method of forming an electronic device on a substrate is provided. The method comprises depositing a seed layer on a substrate, depositing a first printed mask form a fine feature where the fine feature is a gap with a distance smaller then the minimum printed mask dimension, growing a thin film around the first printed mask and on top of the thin film seed layer to form the fine feature, removing the first printed mask, and forming an electrical component with fine features for an electronic device.

In yet another embodiment a method of making a portion of an array of thin film transistors is provided. The method comprises depositing a seed layer on a substrate, depositing a first printed mask to form a fine feature where the fine feature is a gap with a distance smaller then the minimum printed mask dimension, growing a thin film around the first printed mask and on top of the thin film seed layer to form the fine feature, and removing the first printed mask to define the gate electrode regions of the individual thin film transistors in the array of thin film transistors.

In yet another embodiment a method of making a thin film transistor array is provided. The method comprises depositing a seed layer on a substrate, depositing a first printed mask to form a fine feature where the fine feature is a gap with a distance smaller then the minimum mask dimension, growing a thin film around the first printed mask and on top of the thin film seed layer to form the fine feature, removing the first printed mask to define a gate electrode region for a thin film transistor, depositing a second printed mask to define an address line aligned to a gate electrode and to mask the fine feature, etching the thin film layer and the underlying seed layer, and removing the second printed mask to define an address line that connects the gate electrode region to other small gate electrode regions of the thin film transistor array. In some versions of this embodiment, narrow address lines connecting the gate electrodes regions may also be formed with the first printed mask. The address lines and gate electrodes may then form a portion of a thin film transistor array for a backplane circuit.

In yet another embodiment, a method of making a thin film transistor array is provided. The method comprises depositing a seed layer on a transparent substrate, depositing a printed mask to form both a plurality of fine features where the fine feature is a gap with a distance smaller then the minimum mask dimension and a plurality of address lines that connects the plurality of fine features, growing a thin film around the printed mask and on top of the thin film seed layer to form the plurality of fine features, removing the printed mask, removing, the seed layer not covered by the grown film to define a plurality of fine features and the plurality of address lines that connects the plurality of fine features of the thin film transistor array, and depositing a dielectric layer over both the plurality of fine feature and the plurality of address lines.

BRIEF DESCRIPTION OF THE DRAWINGS

FIGS. 5A-K show a schematic side view of the formation of a small gate layer for a thin film transistor and top view images of the transistor at the corresponding process steps according to other aspects of the exemplary embodiment.

DETAILED DESCRIPTION

In the following detailed description a method of forming gate electrodes for fine-feature devices on a substrate using printed patterns will be described. The method may use the system described below for creating a pattern, typically using a printer to controllably eject individual droplets to form a patterned protective layer or coating over-regions of the substrate to define the outline of a feature. Of course, it is to be understood that other printing systems may be used. Regions that were not at one time covered by a protective layer will be subject to deposition (or removal) of materials used to form various features. Thus, feature size will not be limited by droplet size, but instead by how closely droplets can be positioned together without combining to form a single droplet. A system to tightly control the boundaries of the droplet and minimize possible coalescence of juxtaposed droplets will also be described.

Figure 1:
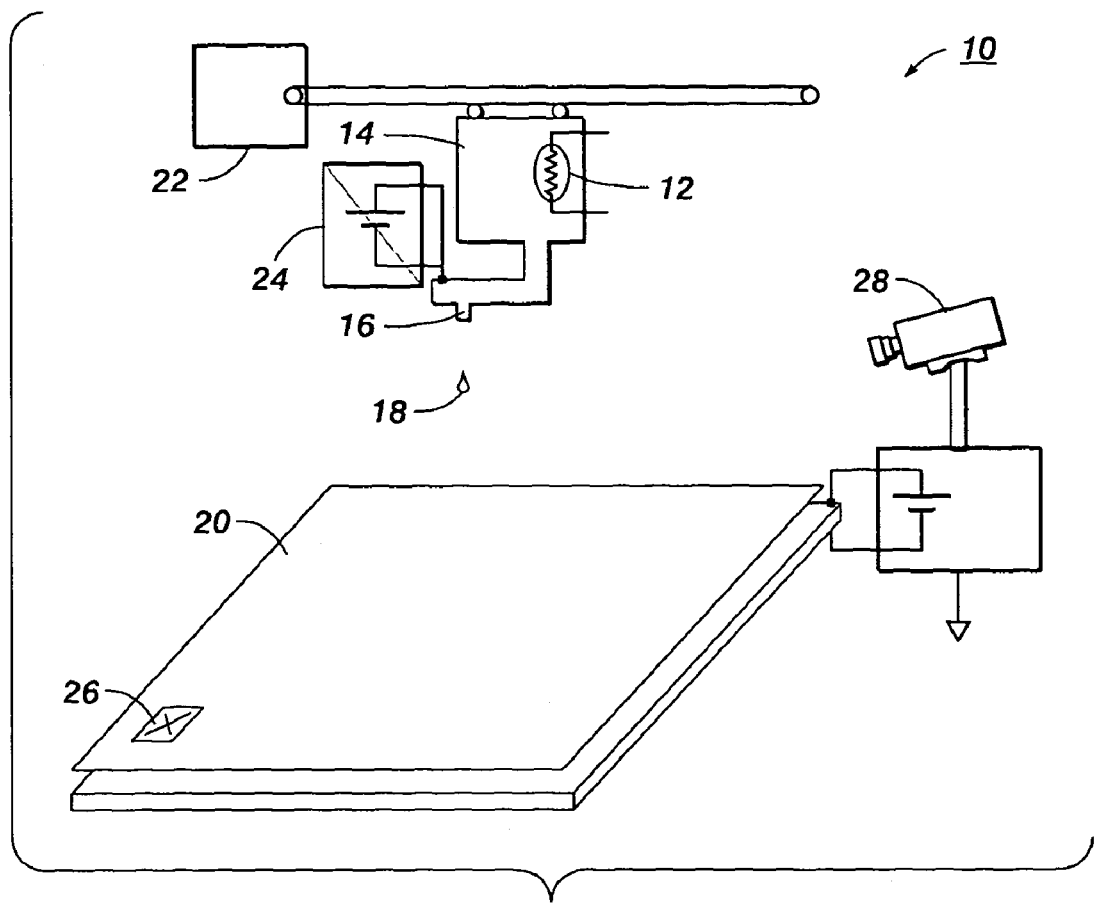
FIG. 1 shows a known droplet source system used to eject a phase-change material onto a substrate.

A system suitable for implementing the embodiments of the method set forth herein is described in U.S. Pat. No. 6,972,261, Wong, et al., for example. FIG. 1 shows the relevant components of a system 10, which includes a heat source 12 that heats a reservoir 14 of typically phase-change material to a temperature that is sufficient to maintain the material in a liquid state. The temperature of the reservoir is generally maintained above 50 degree centigrade and, in some situations, at temperatures above 100 degrees centigrade, a temperature sufficient to liquefy many organic materials that are in the solid phase near room temperature.

The phase-change material may be an organic material that melts at temperatures higher than room temperature. Other desirable characteristics of the phase-change material include that the patterning material is non-reactive with organic and inorganic materials used in typical semiconductor materials processing, and that the phase change material has a high selectivity to etchants. When liquid suspension is used, the substrate material is maintained above the boiling point of the liquid, and after deposition of the patterning material, the liquid carrier evaporates upon contact with the substrate surface. When evaporation is used, the phase change process is directed from liquid to vapor, rather than from liquid to solid.

An additional desirable characteristic of the phase-change patterning material is that the resulting pattern should be robust enough to withstand wet-chemical or dry etching processes. When a dry etching process is used, phase change patterning materials with low-vapor pressures may be used. Wax is an example of a phase-change material with the previously described characteristics. Kemamide 180-based waxes from Crompton Corporation of Middlebury, Conn. are but one example of a suitable wax for use as a phase-change patterning material.

In this system, a plurality of droplet sources such as droplet source 16 receives the liquid phase-change marking material from reservoir 14 and outputs droplets 18 for deposition on a substrate 20. The substrate 20 is maintained at a temperature such that the droplet cools rapidly after deposition.

When increased coalescence between adjacent droplets is required, the substrate temperature can be increased to increase droplet spreading and thereby increase coalescence. When printing lines of Kemamide-based wax from an acoustic ink-jet printer, it has been found that increasing the substrate temperature from 30 degrees to 40 degrees centigrade improves the print quality of the pattern. In the case of Kemamide-based waxes, it has been found that excellent results are achieved when the surface is maintained at 40 degrees centigrade, which is about 20 degrees centigrade below the freezing point of the wax. At 40 degrees centigrade, the temperature of the substrate is still low enough that the droplet rapidly "freezes" upon contacting substrate 20.

After a droplet of marking material is deposited on the substrate 20, the relative positions of the substrate 20 and the droplet source 16 are adjusted to reposition the droplet source 16 over a second position to be patterned. The repositioning operation may be achieved either by moving the droplet source 16 or by moving the substrate 20. As shown in FIG. 1, a control circuit 22 moves the droplet source 16 in a predetermined pattern over the substrate 20. A driver circuit 24 provides energy to the droplet source 16, causing ejection of droplets when the droplet source 16 is positioned over a region of the substrate 20 to be patterned. By coordinating the movement of the droplet source 16 with the timing of droplet source outputs, a pattern can be "printed" on the substrate 20.

The phase change material is generally a solid at temperatures below approximately 60 degrees centigrade. Thus, it may be unnecessary to cool the substrate 20 below room temperature because as previously described, a sufficiently, small droplet cools rapidly when a degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of the droplet source 16, printed alignment marks, such as mark 26, patterned from a previous patterned layer may be used to coordinate the next overlying layer. An image processing system such as a camera 28 may be used to capture the orientation of the previous patterned layer. A processing system then adjusts the position of the overlying pattern layer by altering the pattern image file before actual printing of the pattern layer. In this way, the substrate 20 remains fixed and mechanical movement of the substrate holder is unnecessary. Instead positioning adjustment are accomplished in software and translated to movements of the droplet source 16.

Each droplet source may be implemented using a variety of technologies including traditional ink-jet technology. An alternative technology well suited for generating extremely small droplet sizes is the use of sound waves to cause ejection of droplets of patterning material as done in acoustic ink printing systems, as described in, for example, U.S. Pat. No. 6,972,261, Wong et al.

Figure 2A:
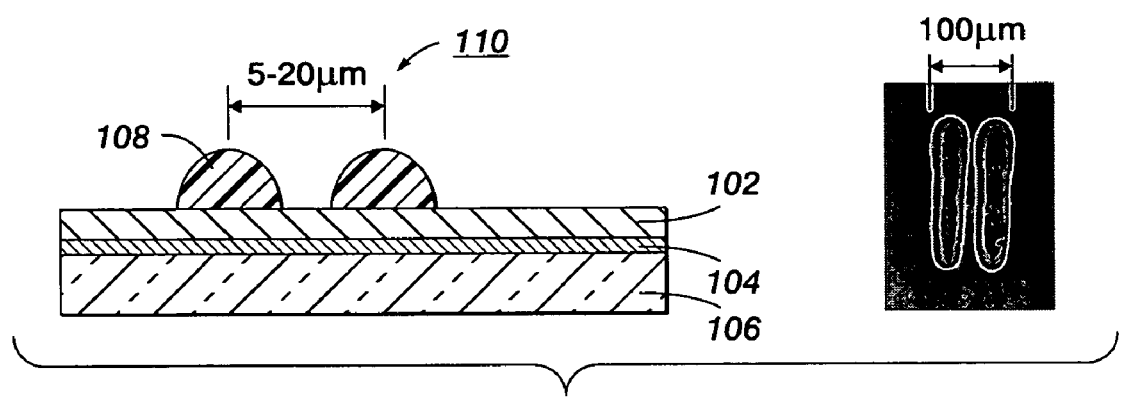
FIGS. 2A-2D show a schematic side view of the formation of a portion of a thin film transistor and top view photographic images of the transistor at the corresponding process steps according to aspects of the exemplary embodiment.

FIGS. 2A-2D show a cross-sectional view of a portion of a thin film transistor (TFT) at various stages in a process to form fine features such as gate electrodes and describes the operations used to fabricate the fine features. Top view images of the fabricated gate of a TFT at the corresponding process step are shown on the right. As used herein, fine features are defined as features that are smaller than the smallest dimension of the printed mask. In the case of some phase change printing systems, the smallest printed mask dimension is near 40 microns and the fine feature is typically between 1 and 40 microns. With reference now to FIG. 2A, a thin film seed layer 102, such as gold, and an adhesion layer 104, such as titanium or chromium, are deposited on a substrate 106 using standard deposition techniques such as sputtering or evaporation. Examples of typical substrates include glass, polymers, such as poly(ethyleneterephthalate), or stainless steel.

With continued reference to FIG. 2A, a printing apparatus, such as the printing apparatus of FIG. 1, ejects droplets of a protective material in a pattern resulting in a first patterned protective mask 108 over the seed layer 102. The protective material may be made of a variety of materials, typically materials that solidify reasonably soon after contact to minimize absorption into the substrate. The protective material may be deposited using a variety of techniques. One method of deposition is described in U.S. Pat. No. 6,742,884 to Wong et al., entitled "APPARATUS FOR PRINTING ETCH MASKS USING PHASE-CHANGE MATERIALS," and U.S. Pat. No. 6,872,320 Wong et al., entitled METHOD FOR PRINTING ETCH MASKS USING PHASE-CHANGE MATERIALS," the disclosures of which are hereby incorporated by reference in their entirety. The rapidly solidifying protective material may be made from a number of different compounds. One example of a suitable protective material is the previously described wax compound such as Kemamide 180-based wax from Crompton Corporation of Middlebury Conn.

The deposited pattern includes a small gap 110 in the first protective mask 108 defining the fine feature metal feature. The minimum dimension of the gap 110 in the first protective mask 108 defines the resolution of the feature(s) to be fabricated and is small relative to the size of the smallest dimension of the printed mask. In this case, the gap 110 is typically, but not restricted to, between 5 and 20 microns wide.

Figure 2B:
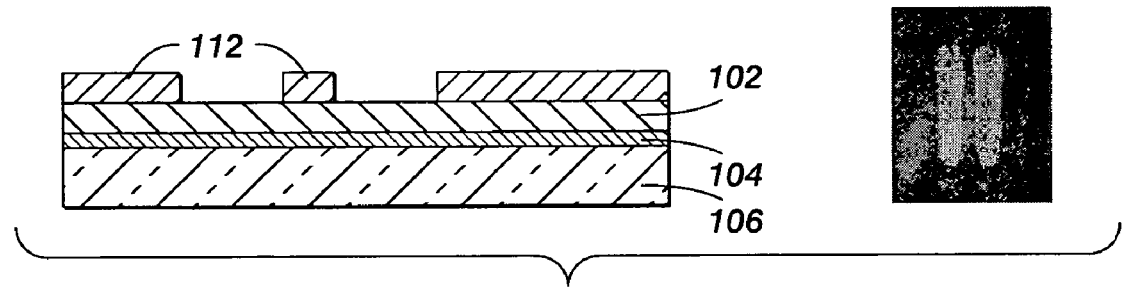

As shown in FIG. 2B, after deposition of the pattern, a material of interest, such as a thin film of electroplated metal 112, is grown on the exposed portions of the seed layer 102 (portions of the substrate not covered by the pattern), including in the gap 110, to form the fine feature metal feature. In one embodiment, the metal comprises electroplated nickel. It is to be understood, however, that other metals may be used, including copper, gold and aluminum. The type of metal used depends on the particular device being fabricated. For example, copper could be used if very low electrical resistivity is required. Nickel or aluminum or alloys, such as nickel-boron, can be used if the material needs to be compatible with silicon based electrical devices. In some cases, the seed layer could be a metal that can be anodized to form a dielectric layer such as aluminum oxide from a seed layer of aluminum. In other cases, the metal could be grown using vapor deposition techniques to grow a metal or dielectric using organometallic precursors that selectively react with seed layers such as silicon dioxide. In these cases, the film growth occurs primarily in the regions of the exposed seed layer and not on the printed mask layer.

After depositing the metal, the first protective mask 108 may be removed (see FIG. 2B). Removal of this mask may be done by a variety of techniques including using organic solvents such as tetrahydrofuran (THF).

Figure 2C:
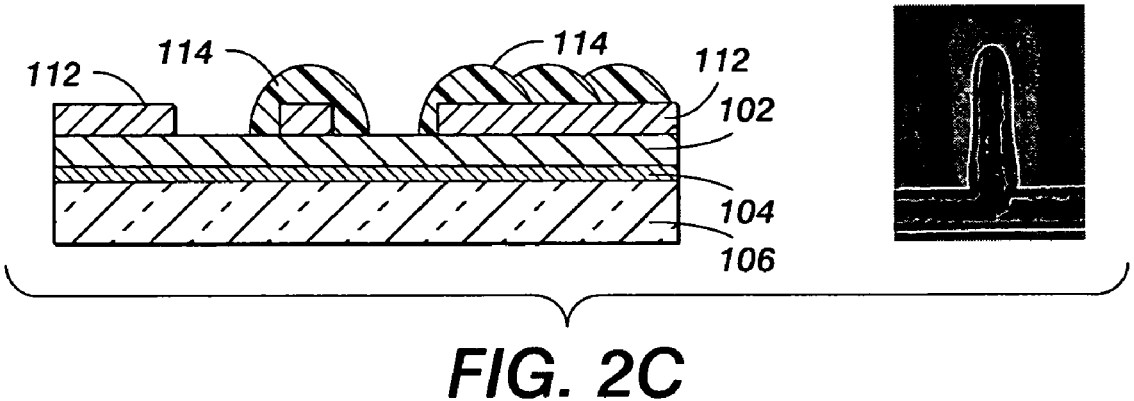

The previous steps define the gate electrode feature. However, in order to allow the TFT to be interconnected to other devices, a gate address line or busline may be formed through further steps. With reference now to FIG. 2C, after removal of the first mask 108, the printing apparatus of FIG. 1 may be used again to eject droplets of a protective material and deposit a second patterned protective mask 114 to pattern the features that have dimensions similar or larger than the minimum feature size of the printed mask as well as to protect the fine features.

Figure 2D:
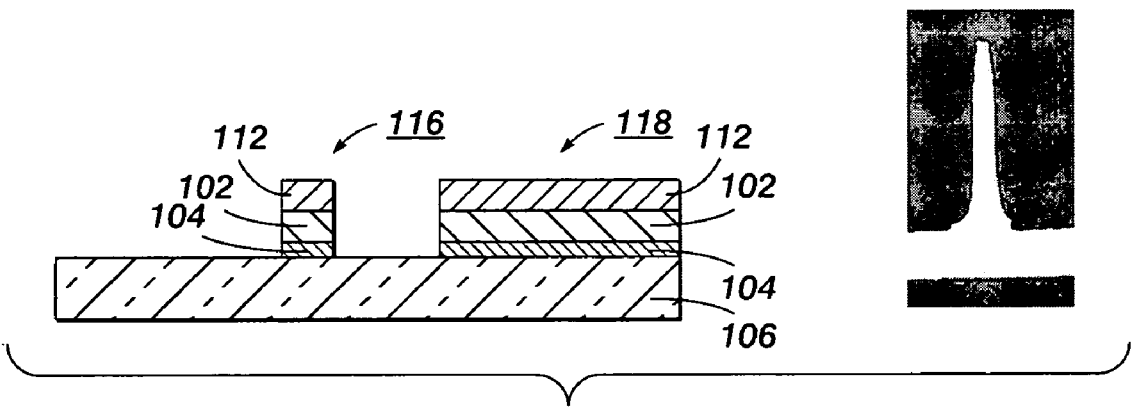

Next, for the portion of the metal layer 112 not covered by the second protective mask 114 the following steps are taken (see FIG. 2D). First, the metal layer 112 is etched. Etching removes portions of the metal layer 112 not covered by the second protective mask 114. The etching may be accomplished using a variety of acids and solvents common in thin film semiconductor processing. After the etching of the metal layer 112, the second protective mask 114, may be removed using organic solvents such as THF. Finally, the metal layer 102 and the adhesion layer 104 are etched.

The process described above allows for the formation of small features, for example, the gate-16 having a feature size smaller than the minimum spot size of an ink jetted wax droplet, to be created between adjacent lines in a printed pattern. Additionally, other fine features or other larger features such as a gate address line trace 118 may be formed. This process of using two masks can thus be used to fabricate a thin film transistor array where the gate electrodes are narrower than the bus lines. This is important because in some cases, the bus lines need to be of low resistance, and wider lines have lower resistance then narrow lines. Increasing line thickness also decreases resistance, and one of the advantages of plating metal is that it makes it easier to make thick films (compared to other techniques such as sputtering and etching), because sputtering and etching thick films is slow.

FIGS. 3A-3D show an alternate embodiment of the small gate fabrication process which does not use gold as a seed layer and is thus more compatible with standard amorphous silicon processing. Nickel plating is used again, but titanium tungsten is used as both the plating seed layer and the adhesion layer. FIGS. 3A-3D illustrate a cross-sectional view of a thin film transistor (TFT) at various stages in a process to form fine features such as gates and describes the operations used to fabricate the fine features, and top view images of the fabricate TFT gate layer at the corresponding process step are shown on the right.

Figure 3A:
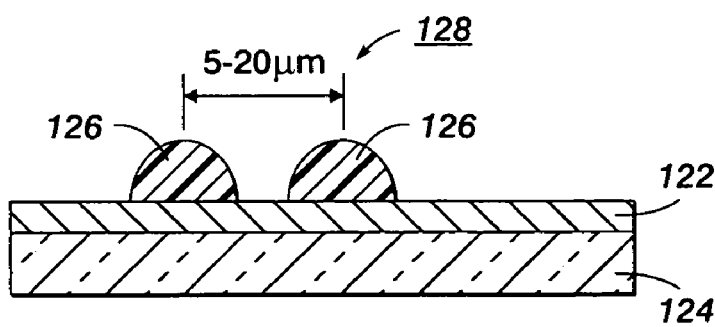
FIGS. 3A-3D show a schematic side view of the formation of a portion of a thin film transistor and top view photographic images of the transistor at the corresponding process steps according to other aspects of the exemplary embodiment.

Beginning with FIG. 3A, a thin film seed layer 122, such as titanium tungsten (TiW) is deposited on a substrate 124 using standard deposition techniques. A printing apparatus such as the printing apparatus of FIG. 1 ejects droplets of a protective material in a pattern resulting in a first patterned protective mask 126 over the seed layer 122. One example of a suitable protective material is the previously described wax compound such as Kemamide 180-based.

The deposited pattern includes a small gap 128 in the first protective mask 126 defining the fine feature. The minimum dimension of the gap 128 in the first protective mask 126 defines the resolution of the feature(s) to be fabricated and is small relative to the size of the smallest dimension of the printed mask. In this case, the gap 128 is typically, but not restricted to between 5 and 20 microns wide.

Figure 3B:
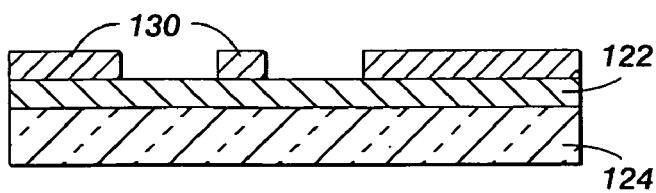
Figure 3C:
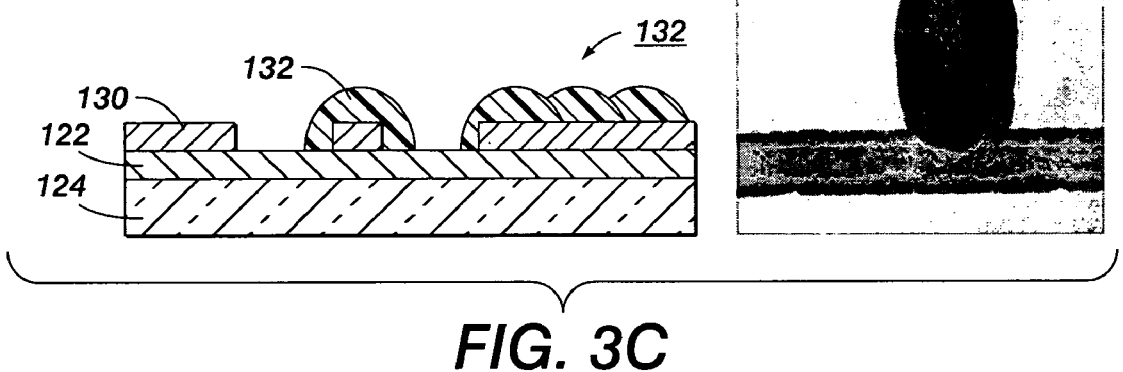

With reference now to FIG. 3B, after deposition of the pattern, a material of interest, such as a thin film of electroplated metal 130, is grown on the exposed portions of the seed layer 122 (portions of the substrate not covered by the pattern), including in the gap 128, to form the fine feature. In one embodiment, the metal comprises electroplated nickel. It is to be understood, however, that other metals may be used, including copper, gold and aluminum. The type of metal used depends on the particular device being fabricated. For example, copper could be used if very low electrical resistivity is. required. Nickel or aluminum can be used if the material needs to be compatible with growth processes for layers used in amorphous silicon devices such as silicon nitride.

After depositing the metal, the first protective mask 126 may be removed. Removal of this mask may be done by a variety of techniques including using organic solvents such as tetrahydrofuran (THF).

The previous steps define the gate electrode. However, in order to allow the TFT to be interconnected to other devices, a gate line trace may be formed through further steps. Thus, after removal of the first mask 126, the printing apparatus of FIG. 1 may be used again to eject droplets of a protective material and deposit a second patterned protective mask 132 to pattern features that are similar or larger than the size of standard printed mask dimensions as well as to protect the fine features from-subsequent etching steps (see FIG. 3C).

Figure 3D:
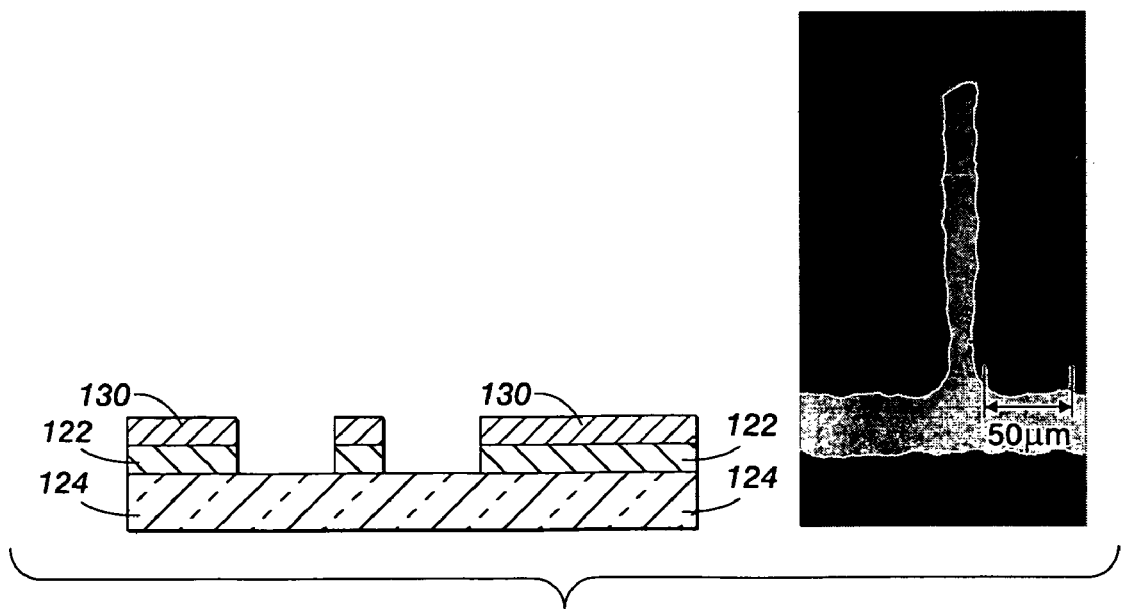

Next, for the portion of the metal layer 130 not covered by the second protective mask 132 the following steps are taken (see FIG. 3D). First, the metal layer 130 is etched. After the etching of the metal layer 130, the second protective mask 132 may be removed using organic solvents such as THF. Finally, the metal layer 122 is etched.

The process described above allows for the formation of small features, for example, the gate 134 having a feature size smaller than the minimum spot size of an ink jetted wax droplet, to be created between adjacent lines in a printed pattern. Additionally, other fine features such as a gate address line trace 136 may be formed.

Figure 4A:
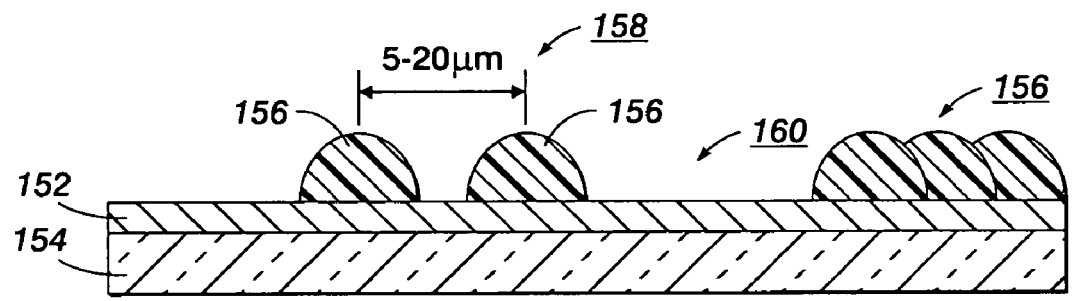
FIGS. 4A-4C show a schematic side view of the formation of a portion of a thin film transistor using one printed mask.
Figure 4B:
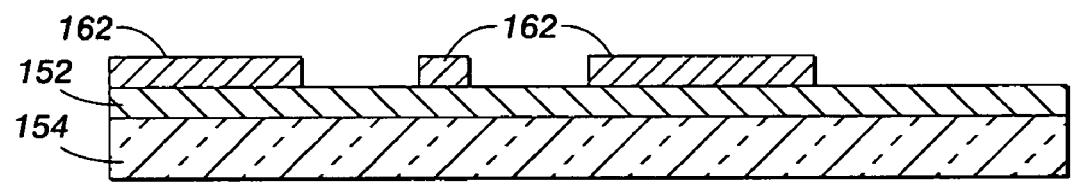
Figure 4C:
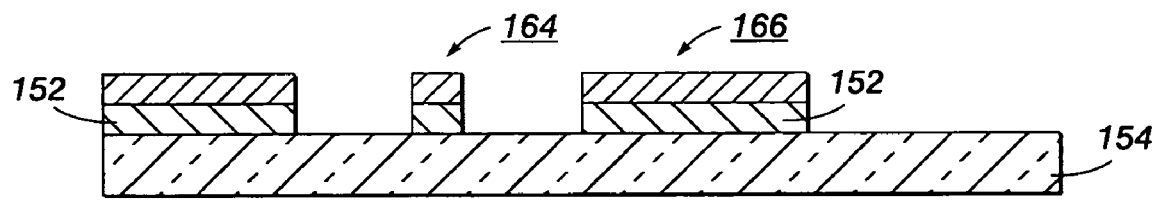

Additionally, a single printed mask may be used to form small gates and large address lines, as shown in FIGS. 4A-4C. With reference to FIG. 4A, a thin film seed layer 152 is deposited on a substrate 154 using standard deposition techniques. Next, a printing apparatus such as the printing apparatus of FIG. 1 ejects droplets of a protective material such as the previously described wax in a pattern resulting in a patterned protective mask 156 over the seed layer 152. The deposited pattern includes a small gap 158 in the protective mask 156, defining the fine feature (i.e., the gate) that is small relative to the size of the smallest dimension of the printed mask, and a gap 160 defining the address lines. The minimum dimension of the gaps 158, 160 in the protective mask 156 define the resolution of the feature(s) to be fabricated.

Turning now to FIG. 4B, after deposition of the pattern, a material of interest, such as a thin film of electroplated metal 162, is grown on the exposed portions of the seed layer 152 (portions of the substrate 154 not covered by the pattern), including in the gaps 158 and 160, to form the feature(s). The metal may comprise, for example, electroplated nickel, copper, gold or aluminum. The type of metal used depends on the particular device being fabricated.

After depositing the metal 162, the protective mask 156 may be removed. Removal of this mask 156 may be done by a variety of techniques including using organic solvents such as tetrahydrofuran (THF). Finally, the seed layer 152 is removed in the non-thin film regions (see FIG. 4C). The result is the formation of a gate 164 and an address line 166.

Other alternatives include other growth methods such as electroless plating instead of electrode plating. In electroless plating the material deposits through chemical reaction, and does not need an externally applied voltage. Nickel, copper, gold and organic polymers are examples of films which can be electrolessly plated. In this case, the thin film seed layer could be thin metal film such as evaporated gold or a surface modified by a reactive organic material in the case of an organic polymer. Electroless plating is also possible to perform directly on a dielectric. In this case the seed layer is effectively a reactive surface treatment which helps to start the electroless plating process. An example is immersion into palladium chloride solution which chemically prepares the surface (seeds the surface) for subsequent electroless film deposition growth.

Another alternative includes the case of electrochemical deposition through anodization. In this method dielectric materials such as an oxide can be grown onto a surface by applying an electric potential in an appropriate chemical bath. An example is the formation of aluminum oxide on an aluminum seed layer.

Yet another alternative is atomic layer deposition, where a precursor gas carrying appropriate compounds chemically reacts and grows on a surface. An example is the reaction of tetramethylaluminum with a silicon dioxide surface followed by cycles of a layer-by-layer reaction of water followed by tetramethylaluminum until the final desired thickness is achieved. These processes are possible at temperatures that are compatible with many materials used as printed phase change masks.

The fine feature printing process described above can be used to effectively reduce the feature size in the gate electrode of a backplane circuit. This reduction in feature size can improve the performance of TFTs in the circuit by reducing the channel length, thus decreasing the resistance of the TFT in the on-state, and by reducing the capacitance of the TFT device. An embodiment to form a small gate layer for a thin film transistor is shown in FIGS. 5A-5K and described below.

Figure 5A:
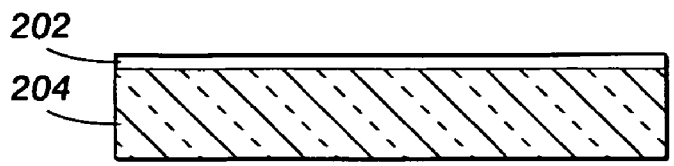
Figure 5B:
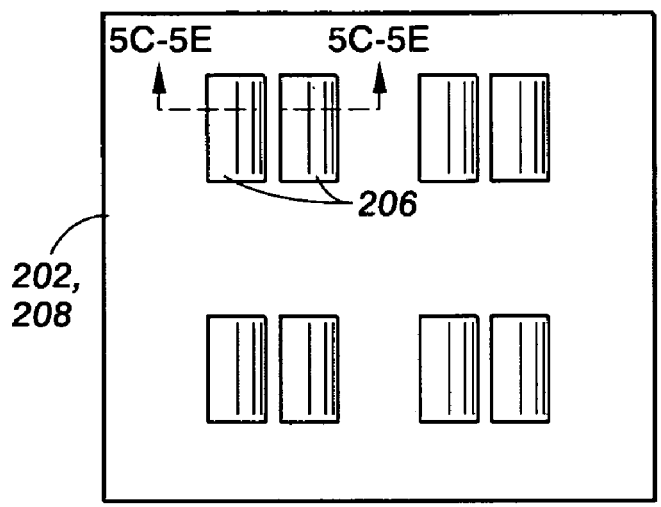
Figure 5C:
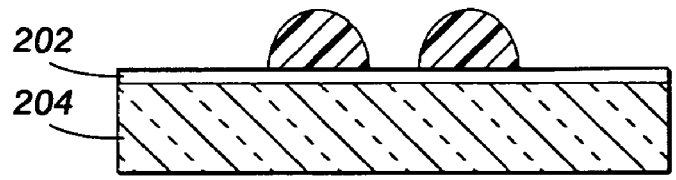

With reference to FIG. 5A, a first seed layer 202 is deposited onto a substrate 204. The seed layer 202 is one that will enable the growth of a layer to be patterned, in this case, a metal to form a gate electrode and associated address line. The substrate may be rigid (e.g., glass) or flexible (e.g., polyethylene napthalate (PEN) or thin stainless steel).

We turn now to FIGS. 5B-5E. A first mask 206 is deposited by jet printing onto the seed layer 202 (see FIG. 5C). The spacing between some regions of the mask is small relative to the size of the drops that can be printed individually.

Figure 5D:
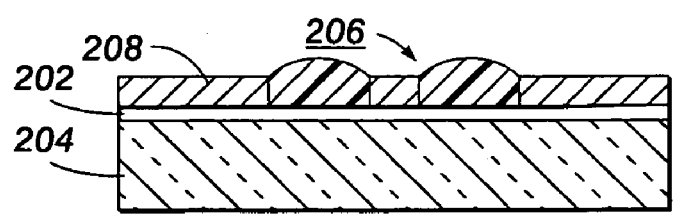

A layer of metal 208 is grown selectively from the seed layer 202 (see FIG. 5D). The metal layer can be grown selectively using processes such as electroplating from an appropriate chemical bath with a potential applied to the seed layer, or electroless plating using an appropriate chemical bath, or by atomic layer deposition from the vapor phase using appropriate precursors. In all cases the growth of the layer is selective to the region of the seed layer and is defined by the chemical reactivity of the seed layer relative to the material used for the mask. Examples of growth materials include nickel, nickel-boron alloys, copper, nickel phosphorous alloys, and gold.

Figure 5E:
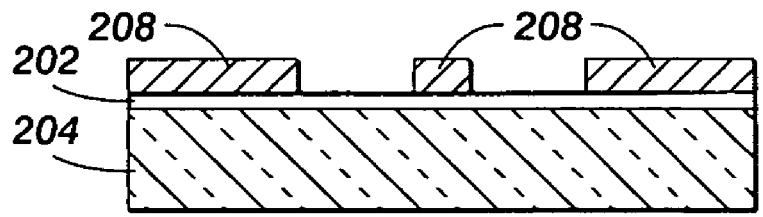
Figure 5F:
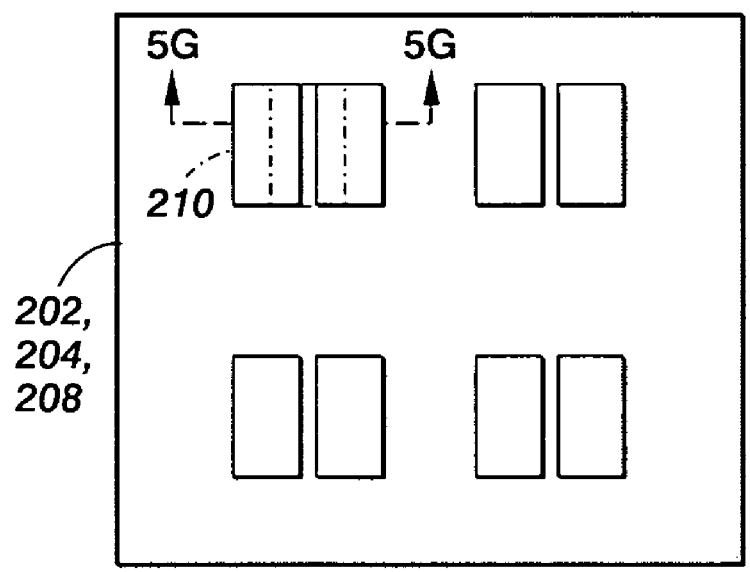
Figure 5G:
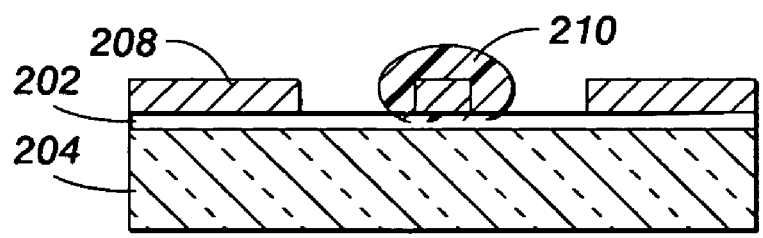
Figure 5H:
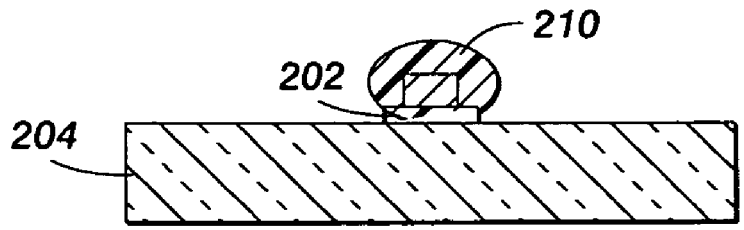

The first printed mask 206 is stripped using an organic solvent or aqueous surfactant solution (see FIG. 5E). With reference now to FIGS. 5F-5K, a second mask 210 is printed to protect the fine feature region defined by the initial printed mask 206 and selective growth and to define an address line that connects the small regions (see FIG. 5G). The grown material 208 and seed layer 202 are then etched using a standard process such as wet chemical etching or dry plasma etching (see FIG. 5H).

Figure 5J:
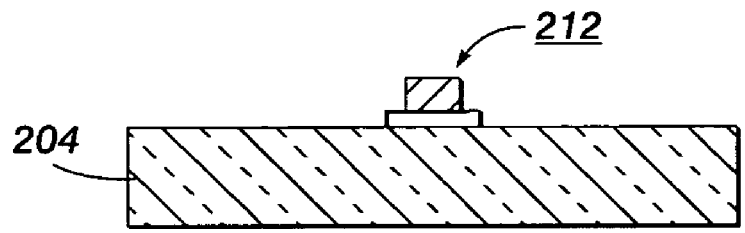
Figure 5K:
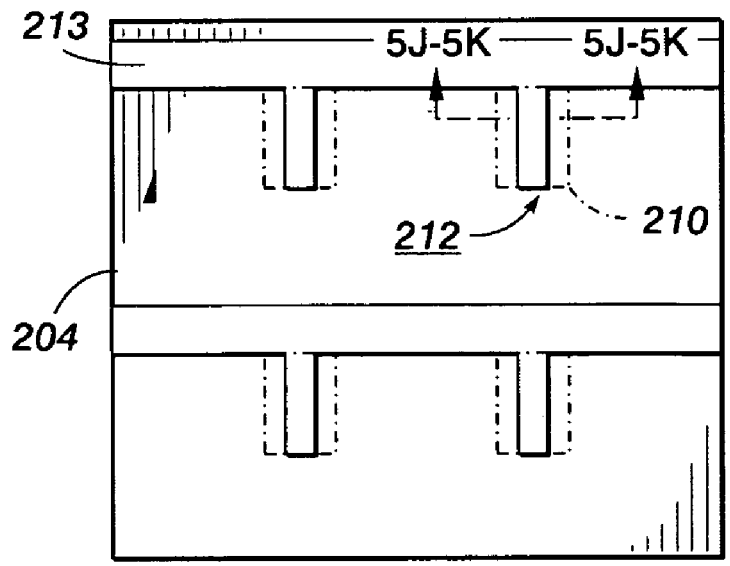

The second printed mask 210 is removed using an organic solvent or aqueous surfactant mixture (see FIG. 5J). The remaining structure comprises a small gate electrode region (212) and associated address line 213 to form a portion of a backplane circuit (see FIG. 5K). The final backplane circuit can be completed using standard processes to define the semiconducting region and source/drain/address line structure. This process can be used to from fine gate electrodes for TFTs that incorporate either inorganic or organic semiconducting materials.

Additionally, the TFT fabrication process shown in FIGS. 5A-5K and described above could use the single printed mask process shown in FIGS. 4A-4C and described above.

An alternative method to pattern the top contact of a TFT device with fine-gate features is by using a self-aligned process. The process illustrated in FIGS. 6A-6J details how the self-aligned TFT structure is fabricated.

Figure 6A:
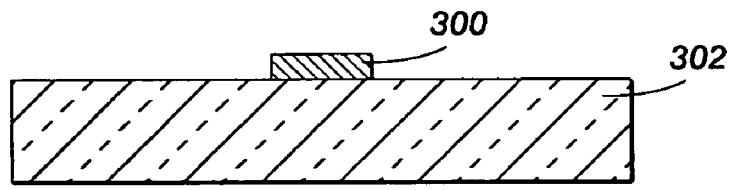
FIGS. 6A-6J show a schematic side view of the formation of the top contacts of a thin film transistor by using a self-aligned process according to other aspects of the exemplary embodiment.
Figure 6B:
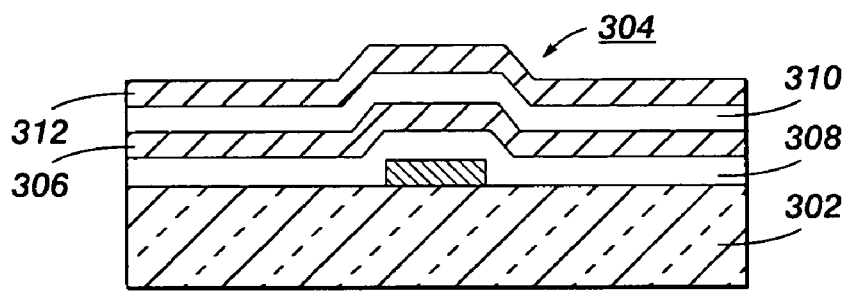
Figure 6C:
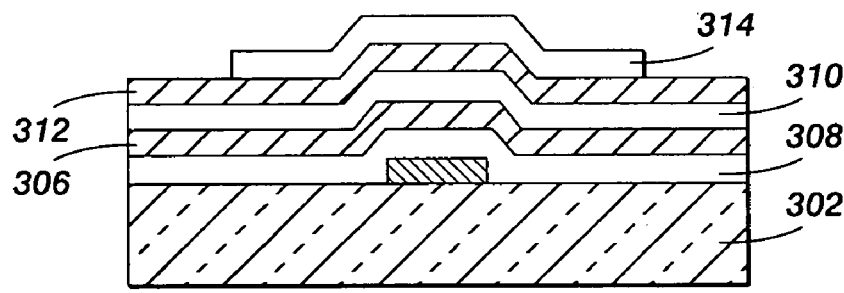
Figure 6D:
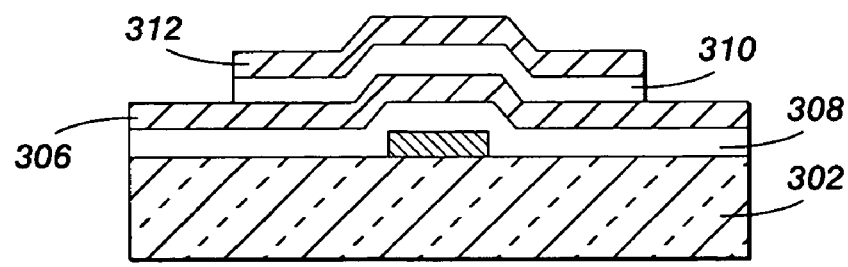
Figure 6E:
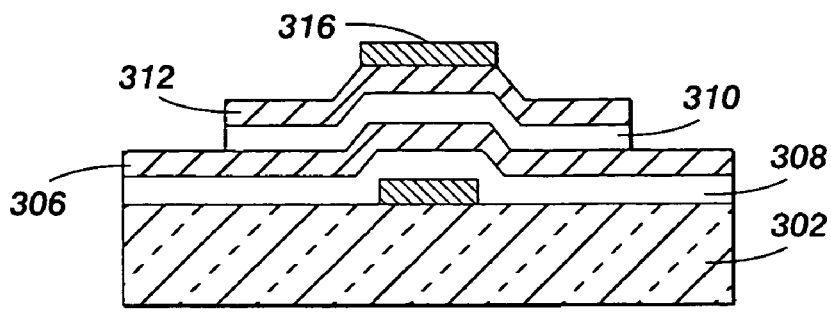
Figure 6F:
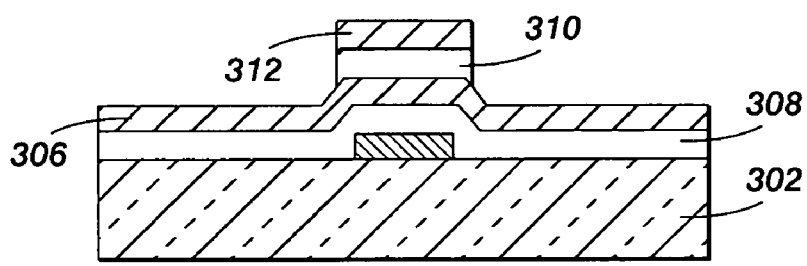
Figure 6G:
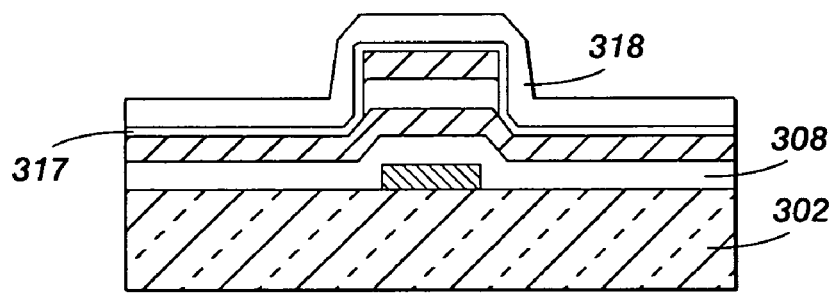
Figure 6H:
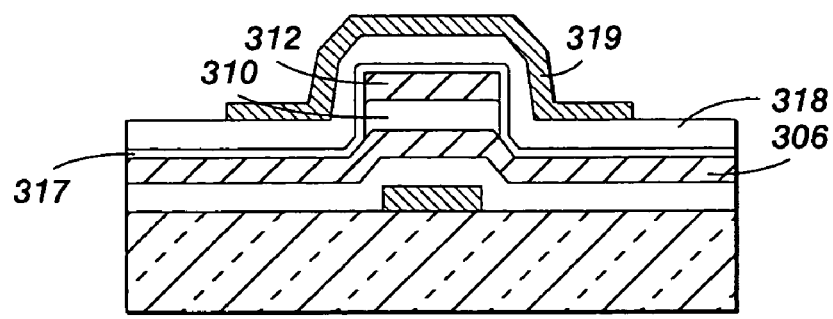
Figure 6I:
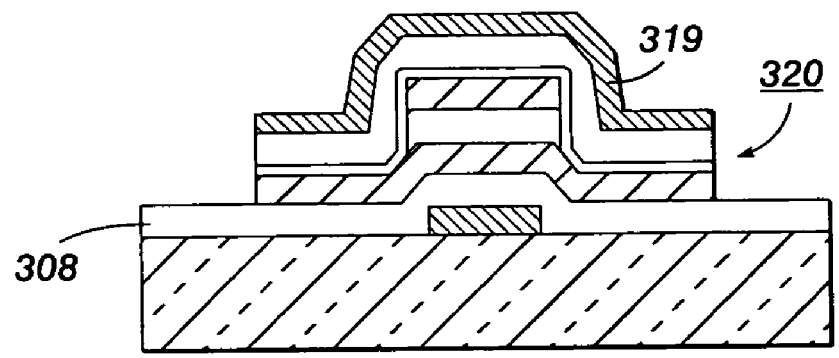
Figure 6J:
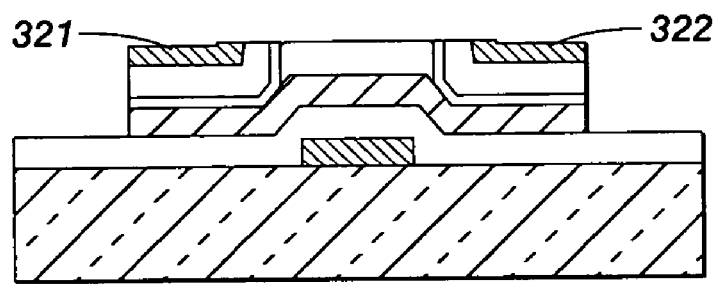

With reference to FIG. 6A, a gate structure 300 is formed on a substrate 302 using the process outlined above in conjunction with FIGS. 4A-4C or FIGS. 5A-5K. As shown in FIG. 6B, a TFT stack 304 is deposited on the substrate 302. The TFT stack 304 comprises a semiconductor layer 306 between a pair of dielectrics 308 and 310 and a sacrificial layer 312. Turning now to FIG. 6C, a printed-wax feature 314 is patterned on the sacrificial layer 312. Then a feature in the sacrificial layer and the top dielectric layer 310 is defined by wet or dry chemical etching (see FIG. 6D). Next, the sacrificial layer 312 is patterned by adding a photoresist 316 and exposing the resist through the transparent substrate (see FIG. 6E). The sacrificial layer 312 and the top dielectric layer 310 are then defined by wet or dry chemical etching (see FIG. 6F). The resist is removed from the substrate using standard processes such as dry etching or removal with a solvent. An ohmic contact layer 317 (e.g. n+−Si) is deposited onto the exposed semiconductor film layer 306 followed by deposition of a top contact layer 318 (see FIG. 6G). Patterning of the top contact 319 is then accomplished using a printed mask process (FIG. 6H). The top contact layer 318, the ohmic contact layer 317, and the amorphous silicon semiconducting layer 306 are then etched and defined (see FIG. 6I showing the isolated TFT island etch 320). Finally, the sacrificial layer 312 is removed to define the source and drain contacts 321, 322 (see FIG. 6J).

The process described in FIGS. 6A-6J could also use the one mask gate process described in connection with FIGS. 4A-4C to form narrow gates and larger buslines.

The process illustrated in FIGS. 6A-6J is generally for a tri-layer hydrogenated amorphous silicon TFT, and it is one method of making discrete self-aligned TFTs. In the array case, the mask 314 is applied to each individual TFT region in the array. to create island covered by the sacrificial material 312. If islands covered by the sacrificial material are not defined, the lift-off process will have overlapping bus lines or the data gate lines will liftoff during fabrication, resulting in a discontinuity along the bus line. The sacrificial layer is then etched away in the regions where the buslines overlap to ensure that this does not occur.

Figure 7A:
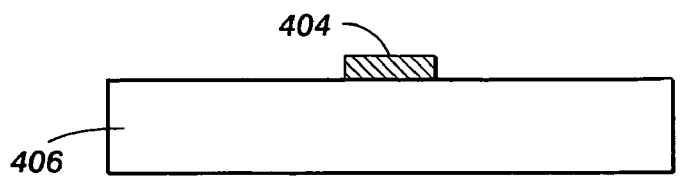
FIGS. 7A-7H show a schematic side view of the stages of a TFT fabrication process for organic semiconductors in accordance with other aspects of the exemplary embodiment.
Figure 7B:
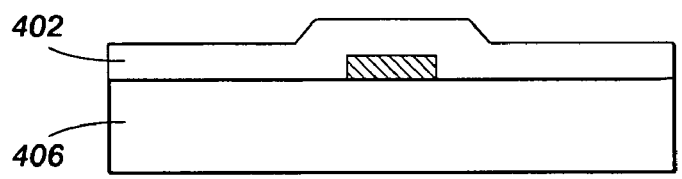
Figure 7C:
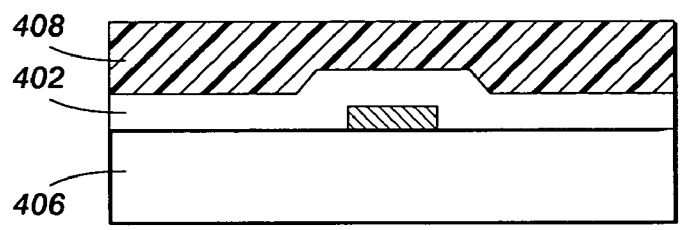
Figure 7D:
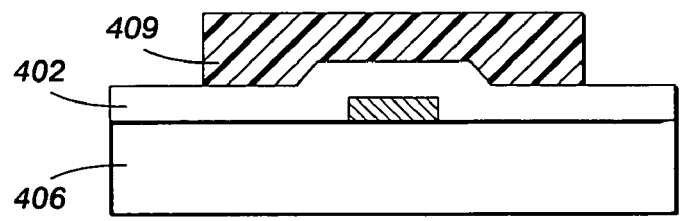

The fabrication of an array of organic semiconducting thin film transistors, such as those using poly(thiophenes) or pentacene as the semiconducting material with self-aligned contacts is shown in FIGS. 7A-7H. With reference to FIG. 7A, the gate electrodes and associated address lines are formed using the process in FIGS. 4A-4C or FIGS. 5A-5K as described previously. A gate dielectric layer 402 is formed over a small feature gate 404 on, a substrate 406 (see FIG. 7B). The gate dielectric layer 402 is typically a thin layer of a vapor deposited material, such as silicon nitride or silicon dioxide, or a coated polymer, such as crosslinked polyvinylphenol or benzocyclobutene. Then, a sacrificial layer 408, for example a photoresist, is formed on top of the gate dielectric layer 402 (see FIG. 7C). For a TFT array, the sacrificial layer 408 is patterned into islands 409 that cover regions over the gate electrode of each individual TFT while not covering regions over the gate busline region (see FIG. 7D). The patterning of the sacrificial layer can be accomplished using standard processing techniques such as photolithography. In some cases, if the sacrificial layer is photoresist then the island layer 409 can be deposited and patterned simultaneously by inkjet printing the photoresist island over the gate electrode region.

Figure 7E:
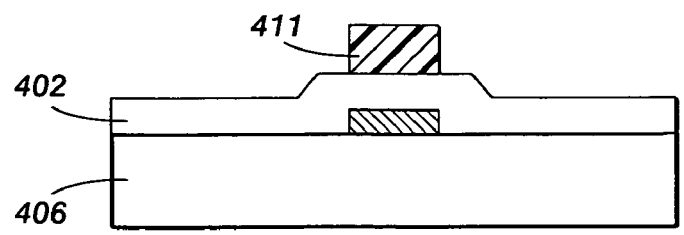
Figure 7F:
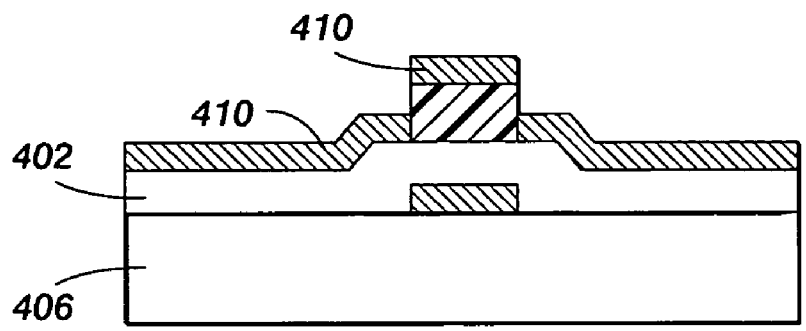
Figure 7G:
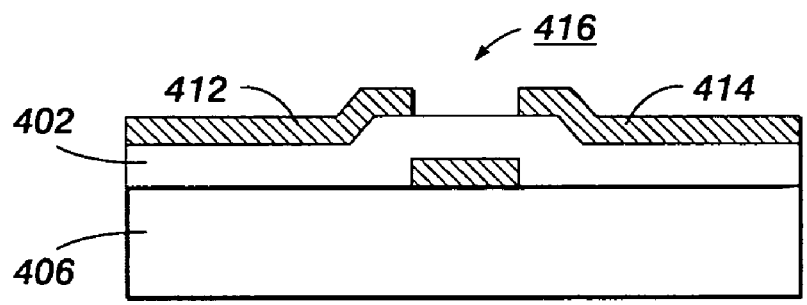
Figure 7H:
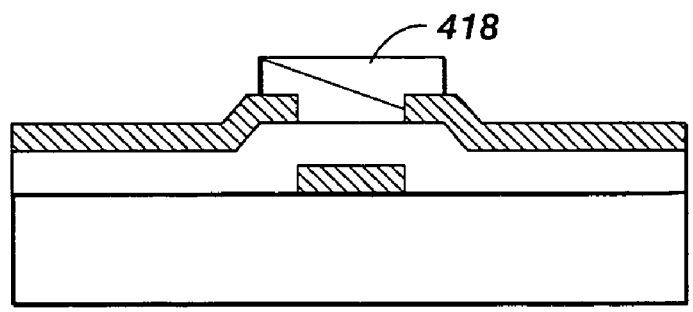

Turning now to FIG. 7E, the sacrificial layer 408 is then removed in the regions where subsequently defined address lines overlap the address lines associated with the gate electrodes to ensure continuity after the self-aligned process that occurs next. The island layer 409 can be defined by back side exposure through a transparent substrate where the gate electrode is used as a self-aligned mask and, for example, the exposed parts of the photoresist are removed by known techniques. As shown in FIG. 7F, a source/drain metal layer 410 is deposited on the newly defined sacrificial layer 411 and the gate dielectric layer 402. Source and drain contacts, electrode regions and an associated address line are patterned using conventional processing such as printing of an etch resist (see FIG. 7G). The final sacrificial layer 411 is then removed to form the final source and drain contacts 412, 414 that are separated by a channel gap 416 defined by the dimension of the final layer 411. With reference now to FIG. 7H, the TFT is completed by deposition and patterning of a semiconducting material 418 over the channel region 416. For solution-processable semiconductors, such as poly(thiophenes) or dispersions of inorganic colloidal particles, the semiconducting material can be deposited and patterned simultaneously by inkjet printing the solution onto the channel region.

Details of the processes illustrated in FIGS. 6A-6J and 7A-7H can be found, for example, in U.S. application Ser. No. 11/184,304, entitled "PATTERNED STRUCTURES FABRICATED BY PRINTING MASK OVER LIFT-OFF PATTERN," by Ana C. Arias, et al., the disclosure of which is hereby incorporated by reference in its entirety.

It will be appreciated that several of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of patterning a feature on a substrate, the method comprising:
   depositing a seed layer on a substrate;
   depositing a first printed mask to pattern a fine feature where the fine feature is defined by a gap formed by two printed features and has a distance smaller than a minimum dimension of a single printed feature;
   growing a thin film around the first printed mask and on top of the seed layer to form the fine feature;
   removing the first printed mask;
   depositing a second printed mask to pattern a second mask layer aligned to the first patterned fine feature to define a second patterned feature and to mask the fine feature;
   etching the exposed thin film and underlying seed layer; and
   removing the second printed mask.

2. The method defined in claim 1 wherein the thin film is a metal or a dielectric.

3. The method defined in claim 1 wherein the growth method for the thin film around the first printed mask comprises electroplating, electroless plating, anodization, or atomic layer deposition.

4. The method defined in claim 1 wherein the first and second printed masks comprise a phase change material.

5. A method of forming an electronic device on a substrate, the method comprising:
   depositing a thin film seed layer on a substrate;
   depositing a first printed mask to pattern a fine feature where the fine feature is defined by a gap formed by two printed features and having a distance smaller than a minimum dimension of a single printed feature;
   growing a thin film around the first printed mask and on top of the thin film seed layer to form the fine feature;
   removing the first printed mask;
   forming an electrical component with fine features for an electronic device;
   depositing a second printed mask to pattern a second mask layer aligned to the first patterned fine feature to define a second patterned feature and to mask the fine feature;
   etching the exposed thin film and underlying seed layer; and
   removing the second printed mask.

6. The method defined in claim 5 wherein the thin film is a metal or a dielectric.

7. The method defined in claim 5 wherein the growth method for the thin film around the first printed mask comprises electroplating, electroless plating, anodization, or atomic layer deposition.

8. The method defined in claim 5 wherein the first and second printed masks comprise a phase change material.

9. The method of claim 5 wherein the electronic device is an amorpohous silicon thin film transistor or an organic thin film transistor.

10. The method of claim 5 wherein the first and second patterned features are co-planar features.

11. A method of making a portion of an array of thin film transistors, the method comprising;
    depositing a thin film seed layer on a substrate;
    depositing a first printed mask to pattern a fine feature where the fine feature is defined by a gap formed by two printed features and having a distance smaller than a minimum dimension of a single printed feature;
    growing a thin film around the first printed mask and on top of the thin film seed layer to form the fine feature;
    removing the first printed mask to define the gate electrode regions of the individual thin film transistors in the array of thin film transistors;
    depositing a second printed mask to pattern a second mask layer aligned to the first patterned fine feature to define a second patterned fine feature and to mask the fine feature;
    etching the exposed thin film and underlying seed layer; and
    removing the second printed mask to define the second patterned fine feature aligned to the first patterned fine feature, such as an address line on the thin film transistor that connects the gate electrode region to another gate electrode region.

12. The method defined in claim 11 wherein the thin film is a metal or a dielectric.

13. The method defined in claim 11 wherein the growth method for the thin film around the first printed mask comprises electroplating, electroless plating, anodization, or atomic layer deposition.

14. The method defined in claim 11 wherein the first and second printed masks comprise a phase change material.

15. The method defined in claim 11 wherein the first pattern defines a fine feature gate electrode and the second pattern defines an address line aligned to the gate electrode.

16. The method defined in claim 11 wherein the gate electrode and address line are used with a circuit containing amorphous silicon or organic semiconductors.

17. The method of claim 11 where the first and second patterned features are co-planar features.

18. A method of making a thin film transistor array comprising:
- depositing a seed layer on a substrate;
- depositing a first printed mask to pattern a fine feature where the fine feature is defined by a gap formed by two printed features and has a distance smaller than a minimum dimension of a single printed feature;
- growing a thin film around the first printed mask and on top of the thin film seed layer to form the fine feature;
- removing the first printed mask to define a gate electrode region for a thin film transistor;
- depositing a second printed mask to define an address line aligned to a gate electrode and to mask the fine feature;
- etching the thin film and underlying seed layer; and
- removing the second printed mask to define an address line that connects the gate electrode region to other gate electrode regions of the thin film transistor array.

19. The method defined in claim 18 wherein the thin film is a metal or a dielectric.

20. The method defined in claim 18 wherein the growth method for the thin film around the first printed mask comprises electroplating, electroless plating, anodization, or atomic layer deposition.

21. The method defined in claim 18 wherein the first and second printed masks comprise a phase change material.

22. The method of claim 18 where the gate electrode and the address line are co-planar.

23. A method of making a thin film transistor array comprising:
- depositing a seed layer on a transparent substrate;
- depositing a printed mask to pattern both a plurality of fine features where a fine feature is defined by a gap formed by two printed features and having a distance smaller than a minimum dimension of a single printed feature and a plurality of address lines that connects the plurality of fine features;
- growing a thin film around the printed mask and on top of the thin film seed layer to form the plurality of fine features;
- removing the printed mask;
- removing the seed layer not covered by the grown film to define a plurality of fine features and the plurality of address lines that connects the plurality of fine features of the thin film transistor array and,
- depositing a dielectric layer over both the plurality of fine feature and the plurality of address lines.

24. The method of claim 23 where the plurality of fine features are gates of a thin film transistor array.

25. The method of claim 23 further comprising forming a self-aligned source and drain electrode by:
- depositing a photodefinable sacrificial layer over the dielectric layer;
- patterning the sacrificial layer to define an island feature over the plurality of fine features;
- exposing incident irradiation through the transparent substrate to define the sacrificial layer self-aligned to the plurality of fine features;
- depositing a metal layer;
- defining the metal layer to form the source, drain and address lines of the TFT array;
- removing the sacrificial layer and metal covering the sacrificial layer to define the source and drain contacts self aligned to the plurality of fine features; and
- depositing and patterning a semiconductor between the source and drain contacts.

26. The method of claim 25 where the semiconductor comprises an organic semiconducting polymer, or organic molecular semiconductor or an inorganic semiconductor.

* * * * *